United States Patent [19]

Shulman

[11] Patent Number: 4,521,730
[45] Date of Patent: Jun. 4, 1985

[54] MERCURY PROBES

[75] Inventor: Carl Shulman, Edgewater, N.J.

[73] Assignee: MSI Electronics Inc., Woodside, N.Y.

[21] Appl. No.: 530,195

[22] Filed: Sep. 7, 1983

Related U.S. Application Data

[63] Continuation-in-part of Ser. No. 226,357, Jan. 19, 1981.

[51] Int. Cl.³ .................. G01R 1/06; G01R 31/26; H01R 3/04
[52] U.S. Cl. .................. 324/158 F; 324/158 P; 339/118 R
[58] Field of Search .............. 324/158 F, 158 P, 72.5; 339/117 R, 117 P, 118 R

[56] References Cited

U.S. PATENT DOCUMENTS 3,794,912 2/1974 Severin et al. ............ 324/158 P
4,101,830 7/1978 Greig .................... 324/158 F

OTHER PUBLICATIONS

Koens, J. G.; "Micromanipulator . . . "; IBM Tech. Dis. Bull.; vol. 15; No. 1; Jun. 1972; p. 334.
"Part No. 1001"; Management Development Corp., p. 1.

Primary Examiner—Ernest F. Karlsen

[57] ABSTRACT

The disclosed mercury probe has one or more mercury reservoirs and one or more passages extending from the reservoir(s) to an aperture plate for engaging a test wafer. Dross that tends to form at the wafer-contact end of the mercury passage(s) is removed by returning all of the mercury in the passage(s) into the reservoir, where the dross is captured. Means is provided to introduce electrical insulation between the reservoir(s) and the aperture(s) of the aperture plate, for disconnecting the mercury probe segment(s) of the mercury from the reservoir(s) and, where there are plural mercury probe segments, for disconnecting them from each other and from their reservoir(s).

20 Claims, 12 Drawing Figures

MERCURY PROBES

The present application is a continuation-in-part of my copending application Ser. No. 226,357 filed Jan. 19, 1981.

BACKGROUND

The present invention relates to mercury-probe test apparatus and a method of its operation. Such test apparatus is widely used for testing semi-conductor wafers, being exemplified in U.S. Pat. Nos. 3,794,912 issued Feb. 26, 1974 to P. J. W. Severin et al, and 4,101,830 issued July 18, 1978 to John H. Greig.

A variety of tests can be performed with mercury probes, each requiring an appropriate number of contacts. Where the tests involve capacitance measurements, the stray capacitance of the test apparatus must be taken into account. In bridge circuits, small values of stray capacitance can be "zeroed out" without appreciably affecting the test accuracy. A large amount of stray capacitance tends to interfere with the test accuracy. The reservoir represents a large contributor to the stray capacitance in apparatus where it remains connected to the wafer-engaging mercury, for example the apparatus shown in the Greig patent mentioned above. The problem is compounded where there are plural mercury-probe contacts each connected to its own mercury reservoir. There, the stray capacitance between reservoirs tends to be especially large.

Mercury probe apparatus having a multiple-aperture support for the test wafer is also used for resistivity measurements. Each test aperture is provided with a separate reservoir in that apparatus.

SUMMARY OF THE INVENTION

The illustrative embodiments of the invention shown in the accompanying drawings and described in detail below incorporate a number of novel features which will be clear from that detailed description.

Mercury-probe test apparatus may have a mercury-filled passage extending from the reservoir to the test aperture(s) in the aperture plate when the mercury comes into contact with the test wafer. The portion of the mercury passage extending to a test aperture is here called the "mercury probe segment." The material forming the passage extending from a reservoir to a mercury probe segment might be metal throughout, but preferably it is at least partly of insulation such as plastic capillary tubing. As is conventional, a pressure difference is developed between the mercury in the reservoir and the test aperture for shifting mercury into the test aperture. In this condition of the apparatus, either the mercury in the passage or that mercury and the wall of the passage form(s) an electrical path interconnecting the reservoir and the mercury probe segment. Means is here provided for breaking such electrical path, and connection to the test circuit is made at the mercury probe segment. In this way the reservoir with its stray capacitance is disconnected from test aperture during tests. In an elemental form, this connection can be interrupted by physically lifting the supply end of a capillary tube out of the mercury reservoir.

In novel mercury probe apparatus, a common reservoir is used to provide mercury for multiple test apertures. Each test aperture has a respective mercury probe segment. In that apparatus, separate capillary tubes may extend into the reservoir or there may be a common supply tube to the reservoir and a manifold interconnecting passages to the mercury probe segments. In either case, any one mercury probe segment is here disconnected not only from the reservoir but from the other mercury probe segments when tests are to be made. This is achieved in exemplary fashion by forming the manifold of electrical insulation and emptying the manifold after the mercury probe segments.

One novel application of features of the invention involves several test apertures that are selectively switched to a test circuit for evaluating several locations of the test wafer. The mercury probe segments terminating at the test apertures are made short and are alike electrically, to a close approximation. The mercury probe segments, when filled with mercury, are disconnected from the mercury passages extending to a common reservoir or to multiple reservoirs. Consequently, the stray capacitance of the apparatus that is zeroed-out for any one mercury probe segment remains in adjustment for the others that are selectively switched to the test circuit. This enables rapid testing of a multiplicity of spots on a test wafer, eliminating the large stray capacitance of the reservoir(s) and avoiding any need to readjust the test apparatus for each newly switched-in mercury probe segment.

Electrical disconnection of a (each) mercury probe segment from its reservoir, and electrical disconnection of each of multiple mercury probe segments from the others may be performed by mechanically interrupting the mercury-filled passage. However, this is achieved in a manner representing a distinctive aspect of the invention. After the mercury has entered the mercury probe segments and test apertures, air is introduced into a portion of the mercury passage formed of insulation, thereby achieving the required disconnection. This applies particularly to apparatus having a manifold, where the manifold is formed of insulation and air is introduced into the manifold to empty it of mercury. In this way the empty manifold represents the required disconnections.

In one form, the novel apparatus involves multiple mercury probe segments extending downward from respective test apertures and a still lower mercury reservoir. Mercury is retained in each of the mercury probe segments during the tests. Thereafter, vacuum at the test apertures is interrupted and the mercury drops out of the mercury probe segments.

In another embodiment, the mercury probe segments extend downward to the test apertures. After the tests, the mercury is drawn back to the reservoir by vacuum developed in the reservoir.

As discussed in my application Ser. No. 226,357, best test results are assured by emptying the entire mercury passage of mercury after each test. That may be accomplished variously. In one way, vacuum developed in the reservoir empties the mercury probe segment and all the rest of the mercury passage. In another way, gravity and surface tension of the mercury serves to empty the entire mercury passage of mercury. Accordingly, any dross that may be picked up by the mercury is carried away and fresh mercury is available in each succeeding test.

In one sense, the present apparatus represents an improvement over the mercury probe in the Greig patent, supra. The Greig apparatus shifts mercury from the reservoir to contact the test wafer by developing vacuum in the interface between the aperture plate and the test wafer. In the novel illustrative apparatus where vacuum is used in this way and where the reservoir is below the level of that interface, mere opening of an intermediate point in the mercury passage(s) to the atmosphere introduces air and effects disconnection of the (each) mercury probe segment from the mercury filling the passage to the reservoir. In a contemplated alternative, air under pressure could be applied to the mercury in the reservoir to shift the mercury along the passage(s) to the mercury probe segments. Air that is introduced under pressure partway along the mercury passage then is effective for disconnecting the mercury probe segment(s) from the reservoir and from each other. However, use of air under pressure for displacing the mercury can lead to hazardous scattering of mercury, so that use of vacuum as in Greig and described below is distinctly superior.

Air may be introduced to break the mercury column in the passage, thereby to break the electrical path along the mercury, by manipulating an air valve. This ordinarily entails a deliberate manipulating step. As a further distinctive feature, the mercury passage can be formed to incorporate a slow air leak. Where vacuum is used as in the Greig patent, to draw the mercury to the test aperture(s), the leak is related to the vacuum at the test aperture so as not to interfere with the supply of mercury to the test aperture. When the mercury reaches the contact aperture, that mercury acts as a plug, and the slow entry of air via the leak into the passage causes a break in the mercury column. The mercury between the leak and the reservoir recedes to the reservoir.

In an analogous system in which the mercury is shifted from the reservoir to the contact aperture under pressure, a slow leak of higher-pressure air could be used to break the column of mercury and the electrical circuit along the mercury passage.

The use of a slow leak rather than a valve has the advantage of self-generated performance, eliminating a deliberate or an automated manipulating step that is involved where valves are used.

In the foregoing exemplary apparatus, it has tacitly been assumed that at least part of the length of the passage is formed of electrical insulation, so that breaking the mercury column in part of the passage formed of insulation has the inherent effect of interrupting the electrical path. However, it is contemplated that the mercury capillary passage may be defined by electrically conductive tubing as of stainless steel that is filled when mercury is drawn to the test aperture, and then both the tubing and the mercury column are replaced by insulation in what may be regarded as a specialized form of switch. This is another way of isolating a reservoir from mercury in a contact aperture, and for isolating each mercury segment leading to a contact aperture from other mercury contact segments where multiple contacts are used.

Mercury is drawn to each test aperture in the Greig apparatus by developing vacuum or sub-atmospheric pressure at the interface between the test wafer and the aperture plate. In novel apparatus detailed below, introduction of air into the mercury passage is performed by venting an insulating portion of the mercury passage. This is done in one manner by manipulating a venting valve. In another distinctive manner, this is done by means of a sustained slow leak that needs no manipulation for introducing air to break the mercury column. The leak is proportioned in relation to the vacuum developed at the test aperture so that filling the test aperture and its mercury probe segment with mercury is assured initially. Thereafter, air leaking into the mercury passage creates the desired gap in the mercury column and the desired break in the electrical path along the mercury from the mercury probe segment to the rest of the mercury passage and the reservoir.

The nature of the invention in its various aspects including the foregoing and other objects, advantages and novel features, will be better appreciated on the basis of the accompanying drawings and the detailed description below of several illustrative embodiments.

THE ILLUSTRATIVE EMBODIMENTS

Figure 1:
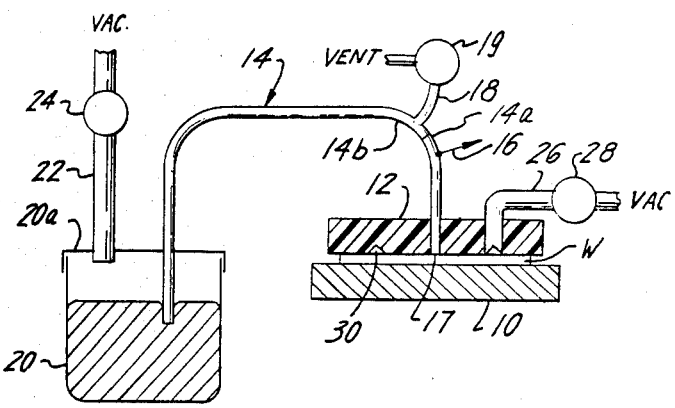
FIG. 1 is a diagrammatic view, partly in vertical cross-section, of mercury-probe apparatus illustrating certain aspects of the invention.
Figure 1A:
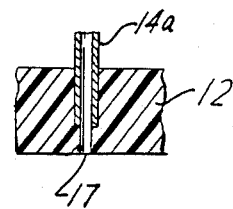
FIGS. 1A and 2A are enlarged cross-sections of portions of FIGS. 1 and 2.

In FIG. 1, a wafer W rests on support 10. For some tests, the material of support 10 (or a large contact area on support 10) is nickel or aluminum or other electrical conductor. Plate 12 of electrical insulation rests on the wafer. A tube 14 provides a passage from reservoir 20 to aperture 17. Tube 14 includes segment 14a that extends into plate 12. Where segment 14a is of insulation, circuit connection 16 to the mercury is made by a wire as of nickel or stainless steel extending through the wall of the tube segment. In a preferred construction, tube segment 14a is of metal such as stainless steel that extends only partway through plate 12 (FIG. 1A) and is aligned with aperture 17. The metal tubing provides the circuit connection to the segment of mercury extending to test aperture 17.

A "T" fitting connects vent line 18 to tube 14. In this way tube 14 is divided into segment 14a and another segment 14b that extends into mercury reservoir 20. Valve 19 is interposed in vent line 18. A vacuum line 22 equipped with valve 24 extends through the sealed cover 20a of the reservoir. Of course, all of the tubing 14a, 14b and 18 that at times contains mercury should be of a material such as plastics, stainless steel or other material that does not form an amalgam. Such materials cause the mercury to form a convex surface, i.e. to bulge into the tubing, when an end of the tubing is immersed in mercury (FIG. 2A).

A vacuum line 26 equipped with valve 28 extends through plate 12 to a circular groove 30 in plate 12 that surrounds aperture 17.

In use of the apparatus, valves 19, 24 and 26 are closed initially. Valve 28 is opened, developing vacuum across the surface of the wafer within groove 30 and drawing mercury from the reservoir into tube 14 and into contact with the surface of wafer W. The opposed surfaces of wafer W and aperture plate 12 are flat and smooth, but vacuum develops rapidly at aperture 17 by virtue of microscopic scratches in the wafer-engaging face of plate 12.

Next, vent valve 19 is opened. The mercury between the "T" fitting and the reservoir and any mercury present in vent line 18 drops back into the reservoir by siphon action, leaving only the limited amount of mercury in tube segment 14a extending into contact with wafer W. This is the "mercury-probe segment" mentioned above. The vacuum in line 26 is maintained, so that atmospheric pressure behind the mercury tends to flatten the meniscus of the mercury at the surface of the wafer. The mercury probe segment and support 10 have test circuit leads 16 and 16'. Notably, the large mass of mercury in the reservoir and the mercury previously in tube segment 14b become disconnected from lead 16. In this way, the test circuit is freed of the stray capacitance that would develop but for the disconnection. It is understood that tube 14b is of insulation, where such disconnection is to occur.

After the tests are completed and before plate 12 is lifted to enable the test wafer to be removed, vent valve 19 is closed, vacuum valve 28 is closed (so that aperture 17 shifts to atmospheric pressure) and vacuum valve 24 is opened. The vacuum that develops in reservoir 20 withdraws the air in segment 14b and then transfers the mercury in tube segment 14a into the reservoir. Obviously—and in ordinary practice—tube 14 is a fine-bore capillary. Air from the wafer surface cannot bubble past the mercury that is to be lifted toward the reservoir. All of the mercury in tubing 14 is returned to the reservoir and dross that may have entered aperture 17 is drawn into the reservoir where it rises to the surface. In the ensuing test operation, fresh mercury enters tubing 14, thus tending to provide a clean mercury probe contact automatically.

After all the mercury in tubing 14 has been returned to the reservoir, the vacuum should be shut off. Otherwise, air from tubing 14 bubbles through the mercury in the reservoir, producing turbulence. This effect is minimized by using a weak vacuum in line 22. Also, at the cost of added complexity, the returning mercury can be directed to the reservoir via a different line through cover 20a that would terminate above the surface of the mercury.

Experience shows that, for consistent results in tests generally, and for the very success of certain tests, a fresh surface of mercury should engage wafer W in each new test cycle.

The vacuum at line 22 in FIG. 1 is effective to empty tube 14 of air and then to withdraw the mercury from the mercury probe segment. That mercury is returned in the reservoir. Any dross that may have entered at aperture 17 tends to float and accumulate in reservoir 20. In each test cycle, mercury stripped of dross is drawn from reservoir 20 and shifted to aperture 17.

For certain tests, it is not important to disconnect the mercury in tubing segment 14a from the rest of the mercury. However, in some tests, it is important to eliminate prominent values of stray capacitance. Even if only one mercury contact is involved, it may be important to minimize stray capacitance by segregating the mercury probe segment 14a of the passage. In Schottky diode tests, capacitance measurements are made to determine the impurity density as a function of the depletion layer boundary depth. Some stray capacitance can be "zeroed out" in the test circuit. However, in FIG. 1 a large amount of stray capacitance is developed between the large-area contact 10 and the reservoir as long as the reservoir remains connected to the mercury probe segment of tube 14a. That stray capacitance may be difficult to "zero out", and it tends to degrade the accuracy of the measurement. Opening of valve 19 after mercury fills tubing segment 14a disconnects the reservoir electrically and eliminates its stray capacitance.

In some tests it may be unnecessary to part the mercury in segment 14a from that in the reservoir. In that case, the vent provision 18, 19 and the vacuum provision 22, 24 could be omitted or it could be disregarded. At the end of the tests, vacuum at groove 30 is interrupted by shutting vacuum valve 26. When that occurs, air can reach aperture 17, allowing the mercury in tubing 14 to return to the reservoir by siphon action. Even if the vacuum line 22 were omitted or not used, the mercury can be self-cleaning, simply by limiting the immersion of tube 14b in the mercury to a depth h discussed below in connection with FIGS. 2 and 2A.

Figure 2:
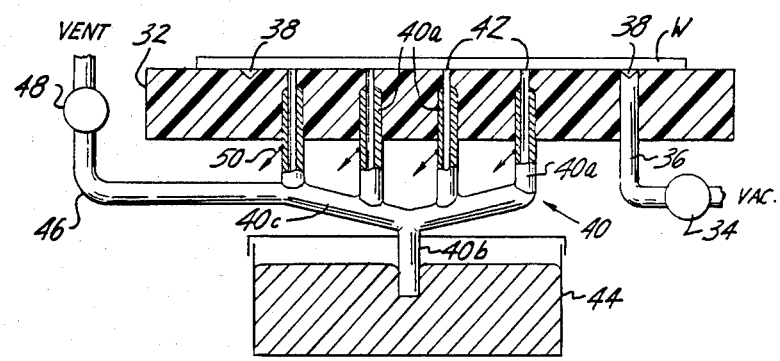
FIGS. 2, 3, 4 and 5 are diagrammatic views, partly in vertical cross-section, of further embodiments of various features of the invention.
Figure 2A:
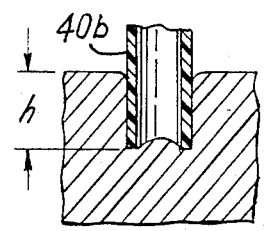

FIG. 2 illustrates mercury probe apparatus that provides a single reservoir serving four mercury contacts. Such four-point-probe contacts enable resistivity measurements to be made by passing current through the wafer between the outermost two mercury-probe contacts and making voltage measurements across the inner two mercury contacts. In other tests, three and even two mercury-probe contacts are used, served by the common reservoir. Indeed, where two mercury-probe contacts are used, as in making Schottky diode tests and whenever stray capacitance is of concern, the apparatus of FIG. 2 has the further advantages discussed above of disconnecting the reservoir and its associated stray capacitance from the mercury that is in the test circuit.

In FIG. 2, wafer W rests on support 32, and is held firmly against the support when vacuum is developed between the wafer and support 32. This occurs when valve 34 in vacuum line 36 is opened, developing vacuum in the circular groove 38. The vacuum develops across the interface beweeen the wafer and plate 32 by virtue of microscopic scratches in the surface of plate 32. Groove 38 surrounds apertures 42 in plate 32.

Four segments of tubing 40a (as in FIG. 1A) extend to apertures 42, to provide four mercury-probe contacts to the wafer. A common length of tubing 40b extends into the mercury reservoir 44. Manifold 40c connects probe segments 40a to each other and to a vent line 46, which is controlled by vent valve 48. Portions 40a, 40b and 40c are collectively identified as tubing 40. Manifold 40c is of electrical insulation.

With valve 48 closed, opening of vacuum valve 34 develops vacuum across the interface of the wafer and plate 32, and vacuum also develops in tubing 40 and vent line 46. Tubing 40 fills with mercury. When tests are to be made, vent valve 48 is opened, allowing the mercury in portions 40b and 40c of the system to drop back into the reservoir. The vacuum is maintained in the interface between the wafer and its support. Therefore the mercury is retained at apertures 42 and in tube segments 40a. There is no problem of the mercury dropping out of apertures 42 and tube segments 40a inasmuch as their diameters are not unduly large.

The desired tests are conducted with vacuum valve 34 open. Opening of vent valve 48 causes discharge of the mercury in manifold 40c, so that tubing segments 40a are electrically disconnected from reservoir 44 and from each other. Suitable test connections 50 are made to tube segments 40a.

When the tests are completed, vacuum valve 34 is closed, the interface between wafer W and plate 32 returns to atmospheric pressure, and the mercury in probe apertures 42 and probe segments 40a drops into the reservoir.

Dross may enter test apertures 42 and would interfere with subsequent tests. The dross can be eliminated automatically in this apparatus by limiting the depth of immersion h of tube 40b in the mercury of the reservoir. While the test apparatus of FIG. 2 includes four probes 40a, 42, this feature is also effective for one or more probes.

The lower end of tubing 40b should be immersed far enough so that, when mercury is withdrawn from the reservoir to fill tubing 40, the mercury in the reservoir does not fall below the opening in the lower end of tube 40b. This is easily arranged. The bore of tubing 40 is made small, so that only a small volume of mercury is needed to fill tubing 40, and the diameter of the reservoir is made appropriately large so that the level of the mercury in the reservoir does not fall excessively in filling the tubing with mercury.

With a limited depth of immersion h (FIG. 2A), surface tension across the tube opening depresses the mercury as shown. During a test, mercury fills tube segments 40a. Following the test, all of that mercury drops into the reservoir. The sudden transfer of the mercury from the tubing into the reservoir tends to carry with it any dross introduced at the contact apertures 42. Once in the reservoir, the dross floats and is captured, as in the apparatus of FIG. 1.

For self-cleaning of the mercury, the depth h of immersion of tube 40b into the mercury in the reservoir before mercury is drawn into tubing 40 should be no greater than about:

$$h = \frac{2S}{\rho g r}$$

where
$\rho$ = density
where
S = surface tension
g = acceleration of gravity
r = radius of the tube.

For mercury, $\rho = 13.5$ and $S = 487$ dynes/cm; and $g = 980$ cm/sec$^2$. The above expression for h is derived by noting that the surface tension of the mercury that resists entry of the mercury into the tube is in equilibrium with the buoyant force tending to elevate the mercury into the tube. At equilibrium:

$$S \cdot 2\pi r = \rho \cdot \pi r^2 h g$$

For mercury, $S = 487$ dynes/cm, and $\rho = 13.5$. Accordingly, $$h = \frac{2 \cdot 487}{13.5 \cdot 980 \cdot r} = \frac{.07362}{r}$$

In an example, where the bore diameter of the tube immersed in the mercury of the reservoir is 0.043 cm or 0.0165 inch, h = 1.75 cm = 0.7 inch or 11/16 inch.

This is the theoretical maximum immersion of the tube for dependable self-clearing of dross from the mercury in the apparatus of FIG. 2. The depth h can be determined empirically for any bore diameter simply by using a sample of the tubing and determining the maximum immersion that occurs before mercury rises appreciably into the tube. However, since the transfer of mercury into the reservoir in practice tends to be sudden, this depth may be exceeded slightly.

Figure 3:
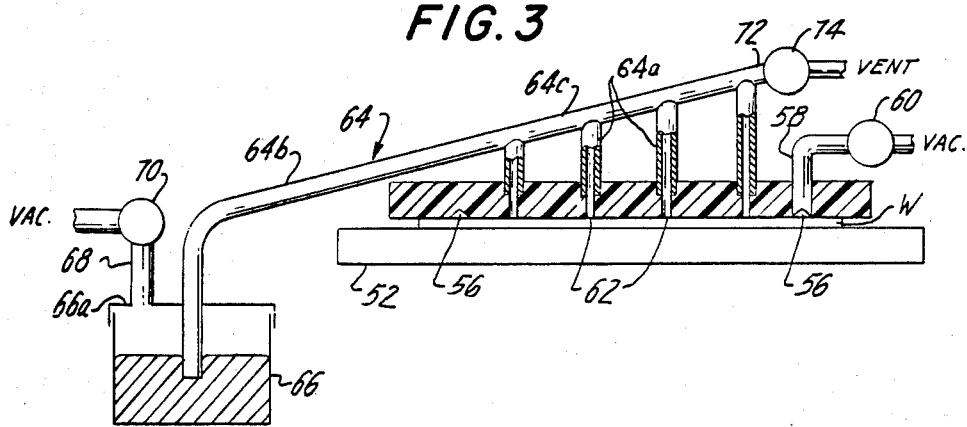

In FIG. 3 as in FIG. 1, contact to the wafer is made from above, and FIG. 3 like FIG. 2 provides multiple mercury-probe contacts that are disconnected from each other and from the reservoir during tests. In FIG. 3, wafer W rests on support plate 52 that may be of insulation or of metal, depending on the tests to be performed.

Plate 52 of electrical insulation has a circular groove 56 connected to vacuum line 58 and vacuum valve 60. Within the circle of groove 56, plate 52 has multiple probe apertures 62 aligned with metal tube segments 64a of the form in FIG. 1A. A return tube 64b provides a mercury passage from reservoir 66 to tube segments 64a via manifold 64c. Portions 64a, 64b and 64c are collectively identified as tubing 64. Tubing 64c is of electrical insulation. Tube segment 64b extends through a seal in sealed cover 66a of the reservoir. A vacuum line 68 and a vacuum valve 70 (when open) develop vacuum in reservoir 66. A vent line 72 equipped with vent valve 74 extends from manifold 64c.

The sequence of operations in FIG. 3 parallels that of FIG. 1. However, in FIG. 3, the plural mercury-probe segments identified with tubes 64a are disconnected both from the reservoir and from each other when vent valve 74 is opened. At this time, vacuum valve 60 is open and vacuum valve 70 is closed. The apparatus of FIG. 3 thus disconnects the mercury probe segments from each other and eliminates the stray capacitance of the reservoir from each and all the mercury-probe contacts.

In each of FIGS. 1, 2 and 3, the vent valve is said to be either open or closed, at different times in the sequence of operations. However, experience shows that if these valves are nearly closed or if they leak ever so slightly, then there would be no need to manipulate them. In fact, they can be replaced by a length of vent line that has a pin-hole in its end remote from the mercury-probe segments 14a, 40a and 64a. In operation, when vacuum develops in the mercury-probe segments, the mercury-passage fills quickly with mercury. Once mercury fills apertures 17, 42 and 62, the vacuum is blocked from the vent line. Air entering the pin-hole—or the leaky valve 19, 48 and 74—of the vent line can then allow the mercury in the tubing (except that in the mercury-probe segments) to return to the reservoir by siphon action. This slight air leak does not interfere with subsequent operation of each apparatus to withdraw the mercury in mercury-probe segments 14a, 40a and 64a due to gravity or reservoir vacuum.

Figure 4:
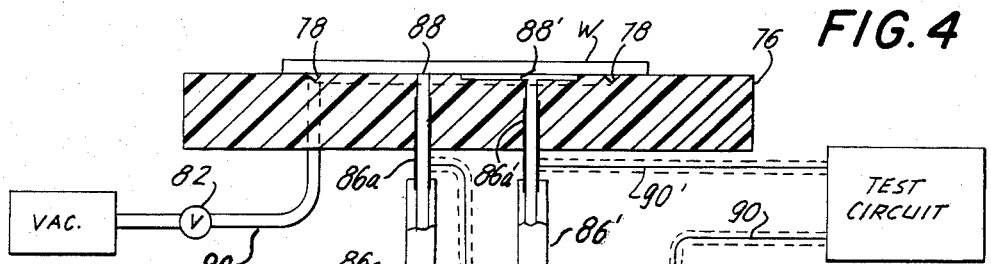
Figure 4A:
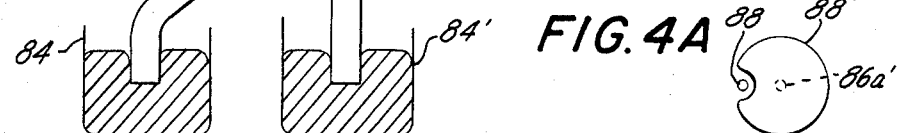
FIG. 4A is top plan view of test apertures of the apparatus of FIG. 4.

FIG. 4 represents a further illustrative embodiment of aspects of the invention. In FIG. 4, wafer W is supported on insulating plate 76, held in place by vacuum in groove 78 in the face of plate 76. Line 80 couples groove 78 to a vacuum source via shut-off valve 82. Mercury from reservoirs 84 and 84' is coupled by tubing 86 and 86' to mercury probe segments 86a and 86a' that terminate at contact apertures 88 and 88'. For Schottky measurements, contact aperture 88 is typically 0.030-inch in diameter whereas contact aperture 88' has an enormously greater area as represented in FIG. 4A. Tubing as of stainless steel forms part of the mercury probe segment formed as in FIG. 1A and extending to each of contact apertures 88 and 88'. Connecting wires 90 and 90' having grounded shields extend from segments 86a and 86a' to the test circuit.

Figure 4B:
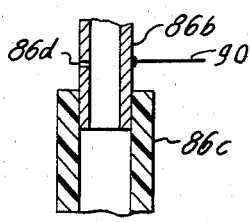
FIG. 4B is an enlarged cross-section of a slow leak, being a portion of the apparatus of FIG. 4.

In the form of apparatus in FIG. 4, mercury probe segment 86a includes metal tubing 86b (FIG. 4B) having a sealed coupling to plastic tubing 86c whose remote end is immersed in the mercury of reservoir 84. The depth of immersion is limited to be self-emptying by gravity and surface tension as described above in connection with FIG. 2A. Valve 82 is opened for developing vacuum in groove 78, to draw the mercury from the reservoir to the contact aperture. Tiny scratches in the interface between wafer W and plate 76 provide air passages from the mercury passage, i.e. the bore of tubing 86 to the vacuum line 80. Mercury rises to the contact aperture 88. Sufficient mercury enters the mercury probe segment 86a to form an electrical connection between the contact aperture 88 and metal tubing 86a to which test lead 90 is connected.

There is a pinhole 86d (FIG. 4B) through the wall of metal tube 86b that is made small enough to sustain the described transfer of mercury into the mercury probe segment when vacuum control valve 82 is opened. Mercury in the passage above the pinhole acts as a plug that seals the bore of tube 86b, isolating the sub-atmospheric pressure at contact aperture 88 from the part of the mercury passage at and below the pinhole. Once this condition develops, slow entry of air via leak 86d into the mercury passage allows mercury in the passage below the pinhole to return to the reservoir. As soon as the mercury below the pinhole descends below the metal tubing into tubing 86c of plastic or other insulation, the circuit between connection 90 and the reservoir is broken. This construction has the advantage over that shown in FIGS. 1–3 in that there is no need to provide a venting valve or to manipulate such a valve. Indeed, the pinhole of FIG. 4B can be used in FIGS. 1–3 as a substitute for the vent valves shown there.

It is desirable (but not essential) that mercury probe segment 86a' should also be provided with the same form of vent (or with a valve) for disconnecting reservoir 84' from mercury probe segment 86a'. In any case, the mercury contact segment 86' is freed of the stray capacitance identified with reservoir 84. The capacitance between the reservoirs would be a large shunt across the capacitance of the wafer being measured, but the problem is eliminated by venting the mercury column in tubing 86. It might be imagined that each lead 90 and 90' has significant capacitance to ground. However, usual test circuits for Schottky diode measurements are made insensitive to capacitance of the test leads to their grounded shields.

As a slight modification, pinhole 86d can be formed in insulating tubing 86c.

Figure 6:
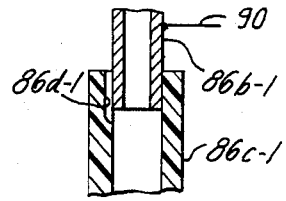
FIGS. 6 and 7 are embodiments of alternative slow leaks useful in FIGS. 1-3 to replace the valved vents therein, these leaks being useful alternatives to that of FIG. 4B.
Figure 7:
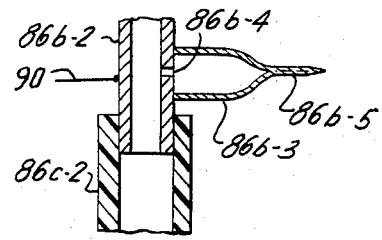

FIGS. 6 and 7 show alternative controlled leaks as substitutes for pinhole 86d and for the vent valves in FIGS. 1, 2 and 3. In FIG. 6, a longitudinal scratch 86d-1 is formed in the inside surface of plastic tubing 86c-1, extending from the atmosphere to a point below the overlap of tubing 86b-1 and 86c-1. Multiple scratches can be used effectively.

FIG. 7 illustrates another substitute for pinhole 86d. Metal tubing 86b-2 has a sealed coupling to plastic tubing 86c-2. A piece of metal tubing 86b-3 is joined by an air-tight connection to metal tubing 86b-2. Hole 86b-4 in tubing 86b-2 forms an air passage between the bores of the two pieces of tubing. This hole is made small enough for normally blocking mercury (with its high surface tension) from entering tube 86b-3. The free end of tubing 86b-3 has a crimp 86b-5 to form a slow leak to the atmosphere. As a substitute for crimp 86b-5, a screw (not shown) may be inserted lengthwise into the bore of tubing 86b-3, alone or with a gasket, to form an adjustable leak. The crimp can also be "worked" to develop desired leakage.

The slow leak 86d, 86d-1 or 86b-5 is made proper for ensuring delivery of enough mercury above the leak to form an electrical path from the contact aperture to metal tube 86b, 86b-1 or 86b-2 and to test lead 90. Mercury in the passage below the leak descends so as to empty at least a portion of insulation tubing 86c, 86c-1 or 86c-2.

Figure 5:
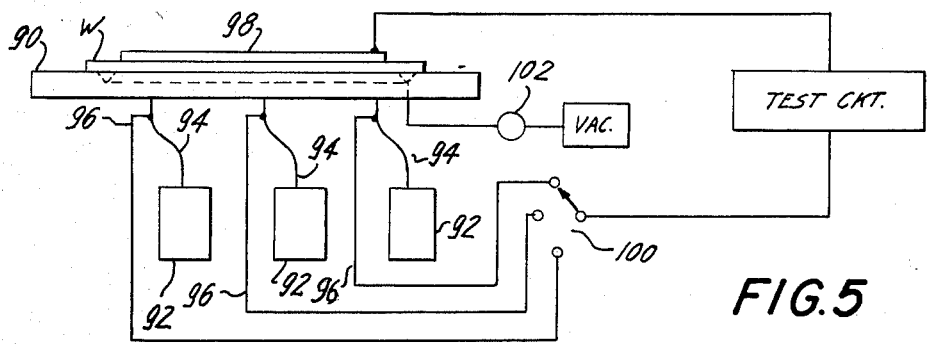

FIG. 5 is a further illustration of features of the invention. In FIG. 5, wafer W rests on plate 90 of electrical insulation. Separate mercury passages are provided by capillary tubing 94 extending from each reservoir 92 to contact apertures in block 90, all of the same form as each other and as tubing 86 and contact aperture 88 in FIG. 4. While three mercury probe contacts are provided in the illustrated apparatus, five or any multiplicity may be provided. Each such passage has a slow leak formed as in FIGS. 4A, 6 or 7 and the leaks are proportioned as describe in connection with FIG. 4. Electrical connections 96 are formed to the mercury probe segments that extend to the contact apertures, as in FIGS. 1A and 4.

A capacitor plate 98 occupies a large area of wafer W on the side opposite plate 90. A direct connection is provided between plate 98 and the test circuit, and connections are provided via selector switch 100 from each connection 98 and the test circuit. All the test-=circuit leads have grounded shields.

In operation, vacuum control valve 102 is opened to develop vacuum in the interface between wafer W and support plate 90, thereby to draw the required amount of mercury into the mercury probe segments. Thereafter, air entering tubing 94 via the respective slow leaks disconnects the mercury probe segments from the reservoirs and eliminates tubing 94 as stray capacitances. By moderate care, the very limited amounts of stray capacitance identified with all of the mercury probe segments connected to the test circuit can be made alike. (It would be a formidable challenge to match the stray capacitances if the reservoirs were to remain connected.) Accordingly, the apparatus of FIG. 5 with its several reservoirs and mercury probe segments can be used to make Schottky diode tests at several places distributed over the area of a test wafer. The apparatus of FIGS. 2 and 3 can also be adapted for multiple tests of a wafer in this manner. In each example, one cycle is needed for drawing the mercury to the wafer at all of the contact apertures, for disconnecting the mercury probe segments from the mercury supply (and from each other), and finally for retracting the mercury from the contact apertures. (In FIG. 2, a plate corresponding to plate 98 is to be added for this application.)

The apparatus of FIG. 5 includes a separate reservoir for each mercury probe segment, but it is evident that a common reservoir could supply the separate passages 94. In that case, there would be no problem of stray capacitances between multiple reservoirs. However, separate leaks into each passage below the respective mercury probe segments and their test leads 96 would serve to disconnect the mercury probe segments from each other, in this way avoiding short-circuits through such single reservoir.

In all of the examples above, air is introduced into the mercury passage to separate each mercury probe segment (which extends to its contact aperture) from the mercury supply reservoir and—where appropriate—for separating mercury probe segments from each other. Notably, the break in each column of mercury develops electrical isolation of its mercury probe segment because the air develops a break in the mercury column in—or extending to—a portion of the passage that is formed of insulation. If the passage were to be formed continuously of metal, it would nullify the effect of air being used to break the mercury column.

Figure 8:
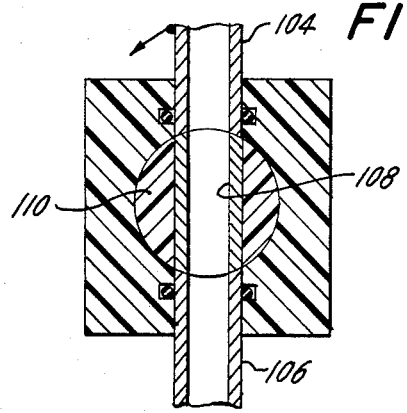
FIG. 8 is an enlarged vertical cross-section of valve means in the passage from any mercury reservoir to any mercury probe segment as an alternative to the air-introducing provisions of FIGS. 1-5.

FIG. 8 shows that, in broad concept, introducing air into a segment of the mercury passage for breaking the electrical path—while exemplary—can be replaced by a structure that is mechanical and, indeed, wherein the wall of the mercury passage can be of metal where the electrical path is to be broken.

In the construction of FIG. 8, sections 104 and 106 of stainless steel capillary tubing are coupled by a third section 108 of stainless steel tubing so that an all-metal passage is provided for supplying mercury to any mercury probe segment in FIGS. 1–5. Tube 108 is fixed in a rotor 110 of insulation in block 112 of electrical insulation. When the mercury probe segment extending from a contact aperture to tube 104 is filled with mercury as in any apparatus of FIGS. 1–5, tubes 106 and 108 have become filled with mercury. Rotor 110 is then rotated 90°. This interposes the insulation of rotor 110 between mercury-filled tube sections 104 and 106. The tests are performed with rotor 110 shifted out of the position shown. Rotor 110 is then returned to its position in the drawing when the mercury is to be retracted from the contact aperture.

As a still further alternative, a continuous length of any capillary tubing can be provided from any one mercury probe segment to its reservoir, and these may be disconnected from each other by mechanically separating the reservoir from the tubing. This construction disconnects the reservoir electrically from the filled tubing and from the test circuit. However, the stray capacitance identified with the filled tubing remains. It can be held to a minimum by minimizing the length of the mercury passage and by providing maximum feasible separation between pieces of the capillary tubing extending to different contact apertures and by shielding each such tube. Such expedients are of only limited efficacy.

The illustrative embodiments of the invention shown in the accompanying drawings and described in detail above are subject to various modifications and the novel features may be variously applied by those skilled in the art. Consequently, the invention should be construed broadly in accordance with its full spirit and scope.

What is claimed is:

1. Mercury-probe apparatus including a mercury reservoir, an aperture member having a test aperture therein, means for forming a mercury contact to a test wafer placed against said aperture member, and contact-forming means including mercury passage means extending between said test aperture and the mercury in the reservoir, said mercury passage means including a mercury probe segment terminating at said test aperture and said mercury probe segment having a test circuit connection thereto, said mercury contact means also including means for developing a pressure difference between the mercury in the reservoir and the test aperture for causing the mercury to fill said mercury passage means from the reservoir to the test aperture, said mercury probe segment and said reservoir having an electrical connection therebetween at least when said passage means is filled with mercury, and means interposed along said mercury passage means between the reservoir and said mercury probe segment for introducing electrical insulation in place of at least part of said electrical connection.

2. Mercury-probe apparatus as in claim 1 wherein a portion of the mercury passage means is formed of electrical insulation, and wherein said insulation introducing means comprises a controlled branch air passage disposed for introducing air into said portion of the mercury passage means that is formed of electrical insulation.

3. Mercury-probe apparatus as in claim 1, said aperture member having a second aperture therein, said apparatus including a manifold of electrical insulation interposed in said mercury passage means and second mercury passage means between said manifold and said second aperture, said second passage means including a second mercury probe segment that terminates at the second aperture and that has a test circuit connection thereto, said pressure difference developing means being operable to cause said mercury passage means to fill with mercury as aforesaid but also to fill said manifold and said second mercury passage with mercury, said means for introducing electrical insulation comprising controlled branch air-passage means at said manifold for introducing air into said manifold replacing the mercury therein, thereby not only introducing electrical insulation between said reservoir and the first-mentioned mercury probe segment as aforesaid, but additionally introducing electrical insulation between the first-mentioned probe segment and said second mercury probe segment and between said reservoir and said second mercury probe segment.

4. Mercury-probe apparatus as in claim 1, further including a second test aperture in said aperture member, a second mercury reservoir, second mercury passage means extending between said second test aperture and said second mercury reservoir, said second mercury passage means including a second mercury probe segment that terminates at said second test aperture and that has a test-circuit connection thereto, and said apparatus having means for developing a pressure difference between the mercury in said second reservoir and the second test aperture for causing mercury to fill said second passage means to said second test aperture, said second mercury probe means and said second reservoir having an electrical connection therebetween at least when the second passage means is filled with mercury, electrical disconnection of the first-mentioned reservoir from the first-mentioned mercury probe segment also isolating said first-mentioned reservoir from the second mercury probe segment.

5. Mercury-probe apparatus as in claim 4, further including means interposed along said second passage means for introducing electrical insulation in place of at least part of said second electrical connection between said second reservoir and said second mercury probe segment.

6. Apparatus as in claim 5, further including a selector switch for connecting said electrical test connections selectively to a test circuit.

7. Mercury-probe apparatus including an aperture member of insulation having plural test apertures therein for mercury to contact a test wafer placed against the aperture member, mercury reservoir means, passage means extending between each of said test apertures and said mercury reservoir means, said passage means including plural mercury probe segments terminating in said test apertures respectively, each of said mercury probe segments having a separate test circuit connection thereto, means for developing a pressure difference between the upper level of the mercury in said reservoir means and each of said test apertures for filling said passage means including each of said mercury probe segments with mercury, said mercury probe segments having electrical connections to said reservoir means at least when said passage means is filled with mercury, and means interposed along said passage means between said reservoir means and each of said mercury probe segments for introducing electrical insulation in place of at least part of each of said electrical connections so as to disconnect each such mercury probe segment from the reservoir means and from the other mercury probe segment or segments.

8. Mercury-probe apparatus as in claim 7, wherein each part of said passage means at which electrical insulation is to be introduced is of electrical insulation and wherein said electrical insulation introducing means comprises branch means for introducing air into such passage part.

9. Mercury-probe apparatus as in claim 7, wherein said reservoir means comprises a common reservoir for all of said test apertures, wherein said passage means to all of said test apertures includes a manifold of electrical insulation, and wherein said means for introducing electrical insulation comprises controlled branch air-passage means entering said manifold for replacing the mercury therein with air and thereby disconnecting each of said mercury probe segments from the others and from the reservoir.

10. Mercury-probe apparatus as in claim 7, said reservoir means including a separate reservoir for each of said test apertures, said pressure difference developing means being arranged to act between each said test aperture and its reservoir, said passage means comprising means forming separate passages from said separate reservoirs to said test apertures, respectively, and said means for introducing electrical insulation in place of at least part of each of said electrical connections comprising separate electrical insulation introducing means for each of said mercury probe segments.

11. Apparatus as in claim 10 wherein each part of said passage means at which electrical insulation is to be introduced is of electrical insulation and wherein said electrical insulation introducing means comprises branch means for introducing air into each said passage part.

12. Mercury-probe apparatus as in claim 2, wherein said means for developing a pressure difference comprises means for developing sub-atmospheric pressure at said test aperture and wherein said branch air-passage means comprises controlled vent means to the atmosphere.

13. Mercury-probe apparatus as in claim 8, 9 or 11, wherein said means for developing a pressure difference comprises means for developing sub-atmospheric pressure at said test apertures and wherein said branch air-passage means comprises controlled vent means to the atmosphere.

14. Mercury-probe apparatus as in claim 12, wherein said vent means comprises a valve.

15. Mercury-probe apparatus as in claim 12, wherein said vent means comprises means for leaking air from the atmosphere at a sufficiently slow rate to sustain shift of the mercury to the test aperture when said pressure difference means is activated.

16. Mercury-probe apparatus as in claim 13 wherein said vent means comprises a valve.

17. Mercury-probe apparatus as in claim 13, wherein said vent means comprises means for leaking air from the atmosphere at a sufficiently slow rate to sustain shift of the mercury to the test apertures when said pressure difference means is activated.

18. Mercury-probe apparatus as in claim 1, wherein said mercury probe segment extends downward to said test aperture, said apparatus further including vacuum means for elevating and removing the mercury from said mercury probe segment after mercury contact to the wafer is no longer needed.

19. Mercury-probe apparatus as in claim 8 wherein said mercury probe segments extend downward to said test apertures, said apparatus further including vacuum means for retracting mercury out of contact with the test wafer and for extracting mercury from said mercury probe segments after mercury test contact to the wafer is no longer needed.

20. Mercury-probe apparatus as in claim 1 wherein said means interposed along said passage means for introducing electrical insulation comprises a body of solid electrical insulation operable into position replacing a portion of the passage means.

* * * * *